United States Patent
Choi et al.

(10) Patent No.: US 8,319,221 B2
(45) Date of Patent: Nov. 27, 2012

(54) ORGANIC LIGHT-EMITTING DISPLAY APPARATUS AND METHOD OF MANUFACTURING THE SAME

(75) Inventors: Jong-Hyun Choi, Yongin (KR); Sung-Ho Kim, Yongin (KR); Joon-Hoo Choi, Yongin (KR)

(73) Assignee: Samsung Display Co., Ltd. (KR)

( * ) Notice: Subject to any disclaimer, the term of this patent is extended or adjusted under 35 U.S.C. 154(b) by 17 days.

(21) Appl. No.: 13/102,419

(22) Filed: May 6, 2011

(65) Prior Publication Data
US 2011/0297944 A1    Dec. 8, 2011

(30) Foreign Application Priority Data
Jun. 7, 2010  (KR) .................. 10-2010-0053599

(51) Int. Cl.
*H01L 29/04* (2006.01)
*H01L 31/20* (2006.01)
(52) U.S. Cl. ............... 257/59; 257/71; 257/72; 257/79; 257/83; 438/34
(58) Field of Classification Search ............. 257/59, 257/71–72, 79, 83, E51.019; 438/34
See application file for complete search history.

(56) References Cited

U.S. PATENT DOCUMENTS
2005/0084994 A1* 4/2005 Yamazaki et al. ............. 438/29
2006/0091791 A1  5/2006 Shin
2006/0246644 A1* 11/2006 Isobe et al. .................. 438/197

FOREIGN PATENT DOCUMENTS
KR  1020040000630  1/2004
KR  1020060113220  11/2006
KR  1020090120698  11/2009

* cited by examiner

*Primary Examiner* — Theresa T Doan
(74) *Attorney, Agent, or Firm* — Knobbe Martens Olson & Bear LLP

(57) ABSTRACT

An organic light-emitting display apparatus and a method of manufacturing the same are disclosed. The organic light-emitting display apparatus includes: an active layer formed on a substrate, a gate electrode including: a first gate electrode layer insulated from the active layer and including a semi-transmissive conductive material, a second gate electrode layer formed on the first gate electrode layer configured to protect the first gate electrode layer, a third gate electrode layer formed on the second gate electrode layer and including a transparent conductive material, and a fourth gate electrode layer formed on the third gate electrode layer and including a conductive material, a pixel electrode including: a first electrode layer formed in the same layer level as the first gate electrode layer and including a semi-transmissive conductive material, a second electrode layer formed on the first electrode layer configured to protect the first electrode layer, a third electrode layer formed on the second electrode layer and including a transparent conductive material, and a fourth electrode layer formed on the third electrode layer and including a conductive material, source and drain electrodes insulated from the gate electrode and electrically connected to the active layer and the pixel electrode, an intermediate layer formed on the pixel electrode and including an organic light-emitting layer, and an opposite electrode formed on the intermediate layer.

18 Claims, 5 Drawing Sheets

ORGANIC LIGHT-EMITTING DISPLAY APPARATUS AND METHOD OF MANUFACTURING THE SAME

CROSS-REFERENCE TO RELATED APPLICATIONS

This application claims the benefit of Korean Patent Application No. 10-2010-0053599, filed on Jun. 7, 2010, in the Korean Intellectual Property Office, the disclosure of which is incorporated herein in its entirety by reference.

BACKGROUND

1. Field

The present disclosure relates to organic light-emitting display apparatuses and methods of manufacturing the same.

2. Description of the Related Technology

A method of manufacturing a flat display apparatus, such as an organic light-emitting display apparatus or a liquid crystal display (LCD) apparatus, is performed on a substrate on which a thin film transistor (TFT), a capacitor, and patterns including wirings for connecting the TFT and the capacitor are formed.

Generally, with regard to substrates of organic light-emitting display apparatuses, in order to form a fine pattern including a TFT and the like, the fine pattern is transferred on the substrate by using a mask on which a fine pattern is formed. As such, when an opening portion is formed in a pixel electrode while the pattern is transferred by using the mask, the pixel electrode may be damaged due to penetration of an etching solution.

In addition, in order to increase the color reproducibility of a flat display apparatus, it a pixel electrode including a plurality of layers is typically formed in order to increase the optical efficiency of the pixel electrode.

SUMMARY OF CERTAIN INVENTIVE ASPECTS

Aspects of the certain embodiments provide organic light-emitting display apparatuses including a pixel electrode having a plurality of layers for improving its optical efficiency, for preventing a pixel electrode from being damaged during manufacturing processes, and methods of manufacturing the same.

One aspect is an organic light-emitting display apparatus including: an active layer formed on a substrate, a gate electrode including: a first gate electrode layer insulated from the active layer and including a semi-transmissive conductive material, a second gate electrode layer formed on the first gate electrode layer configured to protect the first gate electrode layer, a third gate electrode layer formed on the second gate electrode layer and including a transparent conductive material, and a fourth gate electrode layer formed on the third gate electrode layer and including a conductive material, a pixel electrode including: a first electrode layer formed in the same layer level as the first gate electrode layer and including a semi-transmissive conductive material, a second electrode layer formed on the first electrode layer configured to protect the first electrode layer, a third electrode layer formed on the second electrode layer and including a transparent conductive material, and a fourth electrode layer formed on the third electrode layer and including a conductive material, source and drain electrodes insulated from the gate electrode and electrically connected to the active layer and the pixel electrode, an intermediate layer formed on the pixel electrode and including an organic light-emitting layer, and an opposite electrode formed on the intermediate layer.

Another aspect is a method of manufacturing an organic light-emitting display apparatus, the method including: forming an active layer on a substrate, forming a gate electrode including a first gate electrode layer insulated from the active layer and including a semi-transmissive conductive material, a second gate electrode layer formed on the first gate electrode layer, a third gate electrode layer formed on the second gate electrode layer and including a transparent conductive material, and a fourth gate electrode layer formed on the third gate electrode layer and including a conductive material, forming a pixel electrode including a first electrode layer formed on the same layer level as the first gate electrode layer and including a semi-transmissive conductive material, a second electrode layer formed on the first electrode layer, a third electrode layer formed on the second electrode layer and including a transparent conductive material, and a fourth electrode layer formed on the third electrode layer and including a conductive material, forming source and drain electrodes that are insulated from the gate electrode and are electrically connected to the active layer and the pixel electrode, forming an intermediate layer formed on the pixel electrode and including an organic light-emitting layer, and forming an opposite electrode formed on the intermediate layer.

BRIEF DESCRIPTION OF THE DRAWINGS

The above and other features and advantages will become more apparent by describing in detail certain embodiments with reference to the attached drawings in which.

DETAILED DESCRIPTION OF CERTAIN INVENTIVE EMBODIMENTS

Figure 1:
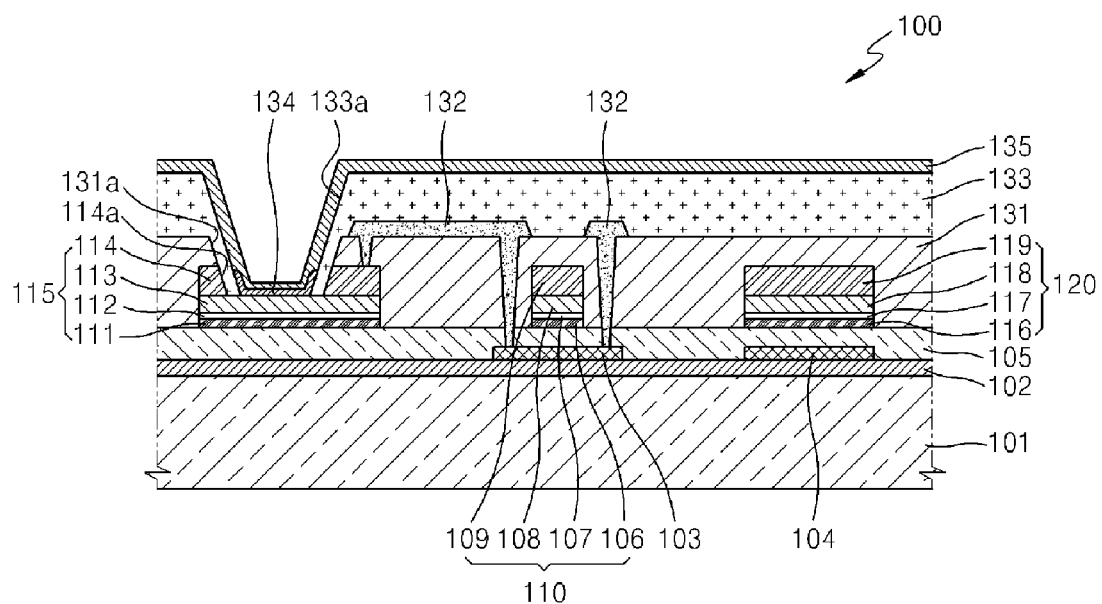
FIG. 1 is a cross-sectional view of an embodiment of an organic light-emitting display apparatus.

Certain embodiments will be illustrated in the drawings and described in detail in the written description. It is to be appreciated that all changes, equivalents, and substitutes that do not depart from the spirit and technical scope of the described embodiments are encompassed in the present disclosure. In the description, certain detailed explanations of related art are omitted when it is deemed that they may unnecessarily obscure the disclosure.

While such terms as "first," "second," etc., may be used to describe various components, such components must not be limited to the above terms. The above terms are used only to distinguish one component from another.

The terms used in the present specification are merely used to describe particular embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Certain embodiments will now be described more fully with reference to the accompanying drawings.

FIG. 1 is a cross-sectional view of an embodiment of an organic light-emitting display apparatus 100.

The organic light-emitting display apparatus 100 includes a substrate 101, an active layer 103, a gate electrode 110, a pixel electrode 115, source/drain electrodes 132, an intermediate layer 134, and an opposite electrode 135.

In some embodiments, the substrate 101 may be formed of transparent glass containing $SiO_2$. In other embodiments, the substrate 101 may be formed of a transparent plastic material such as an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), triacetate cellulose (TAC), and cellulose acetate propionate (CAP).

In bottom emission embodiments of the organic light-emitting display apparatus, in which an image is realized toward the substrate 101, the substrate 101 may be formed of a transparent material. In top emission embodiments of the organic light-emitting display apparatus, in which an image is realized away from the substrate 101, the substrate 101 may may be formed of a metal. In embodiments where the substrate 101 is formed of a metal, the substrate 101 may include at least one material selected from the group consisting of carbon (C), iron (Fe), chromium (Cr), manganese (Mg), nickel (Ni), titanium (Ti), molybdenum (Mo), stainless steel (SUS), Invar alloys, Inconel alloys, Kovar alloys, and the like. In other embodiments, the substrate 101 may be formed of a metal foil.

In order to form a planarized surface on the substrate 101 and to prevent impurity elements from penetrating into the substrate 101, a buffer layer 102 may be formed on the substrate 101. In some embodiments, the buffer layer 102 may be formed of $SiO_2$ and/or $SiN_X$. The buffer layer 102 may be formed by using a deposition method such as a plasma enhanced chemical vapor deposition (PECVD) method, an atmospheric pressure chemical vapor deposition (APCVD) method, or a low-pressure chemical vapor deposition (LPCVD) method, and the like.

The active layer 103, having a predetermined pattern, is formed on the buffer layer 102. In some embodiments, the active layer 103 may be formed of an inorganic semiconductor, such as amorphous silicon or polysilicon. In other embodiments, the active layer 103 may be formed of an organic semiconductor. The active layer 103 includes a source region, a drain region, and a channel region. The source and drain regions may be formed by doping the active layer 103 with impurities. Doping the source and drain regions with a Group-III element such as Boron (B), may form a p-type semiconductor. Doping the source and drain regions with a Group-V element, such as nitrogen (N), may form an n-type semiconductor.

A capacitor lower electrode 104 may be formed on the buffer layer 102, separate from the active layer 103. In some embodiments, the capacitor lower electrode 104 may be formed of an inorganic semiconductor, such as amorphous silicon or polysilicon. In other embodiments, the capacitor lower electrode 104 may be formed of an organic semiconductor.

A gate insulation layer 105 is formed on the buffer layer 102 and covers the active layer 103 and the capacitor lower electrode 104. The gate insulation layer 105 insulates the active layer 103 and the gate electrode 110 from each other. The gate insulation layer 105 may be formed of an inorganic material, such as $SiN_x$ and $SiO_2$, by using a PECVD method, an APCVD method, a LPCVD method, or the like.

The gate electrode 110 is formed on the gate insulation layer 105. The gate electrode 110 may include first through fourth gate electrode layers 106, 107, 108 and 109. The gate electrode 110 may include a first gate electrode layer 106 including a semi-transmissive conductive material, a second gate electrode layer 107 formed on the first gate electrode layer 106 and protecting the first gate electrode layer 106, a third gate electrode layer 108 formed on the second gate electrode layer 107 and including a transparent conductive material, and a fourth gate electrode layer 109 formed on the third gate electrode layer 108 and including a conductive material.

The first gate electrode layer 106 may include at least one of an aluminum (Al) alloy, Ti, Mo, MoW, and Ag. The first gate electrode layer 106 may be formed on the gate insulation layer 105 by using a sputtering method, or the like.

The second gate electrode layer 107 may be formed on the first gate electrode layer 106, and may include Al, or an oxide formed by oxidizing the first gate electrode layer 106 with heat or plasma. In some embodiments, the second gate electrode layer 107 may include at least one of an Al oxide, an oxide of Al alloy, a Ti oxide, a Mo oxide, a MoW oxide, and an Ag oxide.

The third gate electrode layer 108 may be formed on the second gate electrode layer 107, and may include at least one of ITO, IZO, a Zn oxide, GZO, GIZO, GaZO, ZnO, and $In_2O_3$.

The fourth gate electrode layer 109 may include at least one of silver (Ag), magnesium (Mg), aluminium (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and aluminium/copper (Al/Cu). The fourth gate electrode layer 109 may include a plurality of layers. In some embodiments, the fourth gate electrode layer 109 may include a first layer formed of MoW, a second layer formed on the first layer and formed of Al, and a third layer formed on the second layer and formed of Mo.

The pixel electrode 115 may be formed on the same layer level as the gate electrode 110. The pixel electrode 115 may be formed of the same material as the gate electrode 110, and may have the same structure as the gate electrode 110. The pixel electrode 115 may include first through fourth electrode layers 111, 112, 113, and 114. The pixel electrode 115 may include a first electrode layer 111 including a semi-transmissive conductive material, a second electrode layer 112 formed on the first electrode layer 111 and protecting the first electrode layer 111, a third electrode layer 113 formed on the second electrode layer 112 and including a transparent conductive material, and a fourth electrode layer 114 formed on the third electrode layer 113 and including a conductive material.

The first electrode layer 111 may include at least one of an Al alloy, Ti, Mo, MoW, and Ag. In some embodiments, the Al alloy may include Al and at least one of Si, Ni, La, Ge and Co. The first electrode layer 111 may be formed on the gate insulation layer 105 by using a sputtering method, or the like. The first electrode layer 111 may function as a metal mirror that partially transmits light and partially reflects light. The first electrode layer 111 may be used as a semi-transmissive mirror of an organic light-emitting display apparatus having a light resonance structure.

The second electrode layer 112 may be formed on the first electrode layer 111. The second electrode layer 112 may include Al, or an oxide formed by oxidizing the first electrode layer 111 with heat or plasma. In embodiments where the second electrode layer 112 includes an oxide, the second electrode layer 112 may include at least one selected of an Al oxide such as $Al_2O_3$, an oxide of an Al alloy, a Ti oxide, a Mo oxide, a MoW oxide, and an Ag oxide. The second electrode layer 112 prevents the first electrode layer 111 from corroding through a pin hole of the third electrode layer 113. The fourth electrode layer 114 may be etched to expose the third electrode layer 113. The second electrode layer 112 prevents a reduction in a hole injection efficiency due to the first electrode layer 111 having semi-transmissive characteristics. The second electrode layer 112 prevents a reduction in the optical efficiency of the organic light-emitting display apparatus 100 due to the first electrode layer 111. In some embodiments, the second electrode layer 112 may include an oxide-containing material.

The third electrode layer 113 may be formed on the second electrode layer 112, and may include at least one of ITO, IZO, ZnO, GZO, GIZO, GaZO, a Zn oxide and $In_2O_3$. In some embodiments, with the third electrode layer 113 formed of ITO, a heat treatment process may be used. In such embodiments, while crystallizing ITO, the size and number of pin holes formed in the ITO may increase.

The fourth electrode layer 114 may include at least one of Ag, Mg, Al, Pt, Pd, Au, Ni, Nd, Ir, Cr, Li, Ca, Mo, Ti, W, MoW, and Al/Cu. A portion of the fourth electrode layer 114 may be removed to form a first opening portion 114a so as to expose the third electrode layer 113 through the first opening portion 114a. The intermediate layer 134 contacts the third electrode layer 113 of the pixel electrode 115 through the first opening portion 114a.

A capacitor upper electrode 120 may be formed on the gate insulation layer 105 so as to face the capacitor lower electrode 104. The capacitor upper electrode 120 may be formed of the same material as the gate electrode 110 and the pixel electrode 115. The capacitor upper electrode 120 may have the same structure as the gate electrode 110 and the pixel electrode 115. The capacitor upper electrode 120 may include first through fourth capacitor electrode layers 116, 117, 118 and 119. The capacitor upper electrode 120 may include a first capacitor electrode layer 116 including a semi-transmissive conductive material, a second capacitor electrode layer 117 formed on the first capacitor electrode layer 116 and protecting the first capacitor electrode layer 116, a third capacitor electrode layer 118 formed on the second capacitor electrode layer 117 and including a transparent conductive material, and a fourth capacitor electrode layer 119 formed on the third capacitor electrode layer 118 and including a conductive material. The first through fourth capacitor electrode layers have been described in detail with the detailed descriptions of the gate electrode 110 and the pixel electrode 115, and thus their detailed description will not be repeated.

The capacitor lower electrode 104 and the capacitor upper electrode 120, which are respectively formed on and below the gate insulation layer 105 to form one capacitor, are formed in the same layer level, like the active layer 103 and the gate electrode 110. Accordingly, the thickness of the organic light-emitting display apparatus 100 may be efficiently reduced.

A planarization layer 131 may be formed on the gate insulating layer 105 and may cover the gate electrode 110, the pixel electrode 115, and the capacitor upper electrode 120. The planarization layer 131 may be formed of various insulation materials. In some embodiments, the planarization layer 131 may be formed of an inorganic material, such as an oxide or a nitride. In other embodiments the planarization layer 131 may be formed of an organic material.

Some examples of inorganic insulation layer materials for forming the planarization layer 131 include $SiO_2$, $SiN_x$, SiON, $Al_2O_3$, $TiO_2$, $Ta_2O_5$, $HfO_2$, $ZrO_2$, BST, and PZT. Some examples of organic insulation layer materials for forming the planarization layer 131 include a general-use polymer (PMMA, PS), a polymer derivative having a phenol group, an acrylic polymer, an amide-based polymer, an aryl ether-based polymer, an amide-based polymer, a fluorine polymer, a p-xylene-based polymer, a vinyl alcohol-based polymer, and a blend of these. The planarization layer 131 may be formed of a composite stack of an inorganic insulation layer and an organic insulation layer. The planarization layer 131 may be formed by using a spin coating method or the like.

The planarization layer 131 may include a second opening portion 131a above the first opening portion 114a.

The planarization layer 131 may include a contact hole exposing the source/drain regions of the active layer 103. The source/drain electrodes 132 may be formed to respectively contact the source/drain regions of the active layer 103 via the contact hole. The source/drain electrodes 132 are connected to the fourth electrode layer 114 of the pixel electrode 115.

In some embodiments, the source/drain electrodes 132 may have a multi-layered structure.

A pixel defining layer 133 may be formed on the planarization layer 131 and may cover the source/drain electrodes 132. The pixel defining layer 133 may include a third opening portion 133a that exposes the third electrode layer 113 of the pixel electrode 115. The third opening portion 133a may be formed to contact the first opening portion 114a or may be formed in the first opening portion 114a. In some embodiments, the pixel defining layer 133 may be formed of an organic material. In other embodiments, the pixel defining layer 133 may be formed of an inorganic material.

The intermediate layer 134 may be formed in the third opening portion 133a to contact the third electrode layer 113 of the pixel electrode 115. The intermediate layer 134 may include an organic light-emitting layer.

The intermediate layer 134 may emit light by electrical driving of the pixel electrode 115 and the opposite electrode 135.

The intermediate layer 134 may be formed of an organic material. In embodiments where the organic light-emitting layer included in the intermediate layer 134 is formed of a low-molecular weight organic material, a hole injection layer (HIL) and a hole transport layer (HTL) may be disposed between the organic light-emitting layer and the pixel electrode 115, and an electron transport layer (ETL) and an electron injection layer (EIL) may be disposed between the organic light-emitting layer and the opposite electrode 135. Other layers may also be stacked. Examples of the organic material for forming the intermediate layer 134 include copper phthalocyanine (CuPc), N,N'-Di(naphthalene-1-yl)-N,N'-diphenyl-benzidine (NPB), tris-8-hydroxyquinoline aluminum (Alq3), and the like.

In embodiments where the organic light-emitting layer is formed of a polymer organic material, the intermediate layer 134 may include only an HTL that is disposed between the organic light-emitting layer and the pixel electrode 115. The HTL may be formed of, for example, poly(2,4-ethylenedioxythiophene) (PEDOT) or polyaniline, and may be formed on the pixel electrode 115 by using an inkjet printing method, a spin coating method, or the like. The polymer organic light-emitting layer may be formed of PPV, soluble PPV's, cyano-PPV, polyfluorene, etc. and a color pattern may be formed in the organic light-emitting layer by using an inkjet printing method, a spin coating method, a thermal transfer method using a laser, or the like.

The opposite electrode 135 may be formed on the intermediate layer 134. The opposite electrode 135 may be formed by depositing a metal having a low work function, such as Ag, Mg, Al, Pt, Pd, Au, Ni, Nd, Ir, Cr, Li, Ca, and a compound of these, or the like, and depositing a transparent conductive material, such as ITO, IZO, ZnO, or $In_2O_3$, or the like thereon.

A sealing member (not shown) may be formed on the opposite electrode 135. The sealing member may be formed to protect the intermediate layer 134 and/or other layers from water or oxygen from the outside, and may be formed of a transparent material. In some embodiments, the sealing member may be formed of glass, plastic, or a multi-layer structure of organic and inorganic materials.

FIGS. 2 through 8 are cross-sectional views illustrating an embodiment of a method of manufacturing the organic light-emitting display apparatus 100 of FIG. 1.

The method will be described sequentially in manufacturing order with reference to FIGS. 2 through 8.

Figure 2:
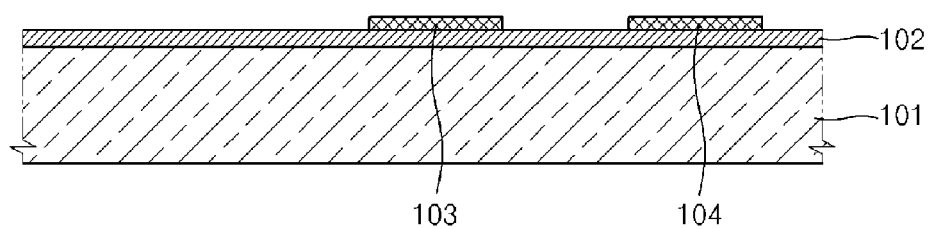
FIGS. 2 through 8 are cross-sectional views of an embodiment of a method of manufacturing an organic light-emitting display apparatus.

First, referring to FIG. 2, the buffer layer 102 is formed on the substrate 101, and the active layer 103 and the capacitor lower electrode 104 are formed on the buffer layer 102. The active layer 103 and the capacitor lower electrode 104 each have a predetermined pattern and are separated from each other. In some embodiments, the active layer 103 and the capacitor lower electrode 104 may be formed at the same time by using a photolithography method using one mask.

Figure 3:
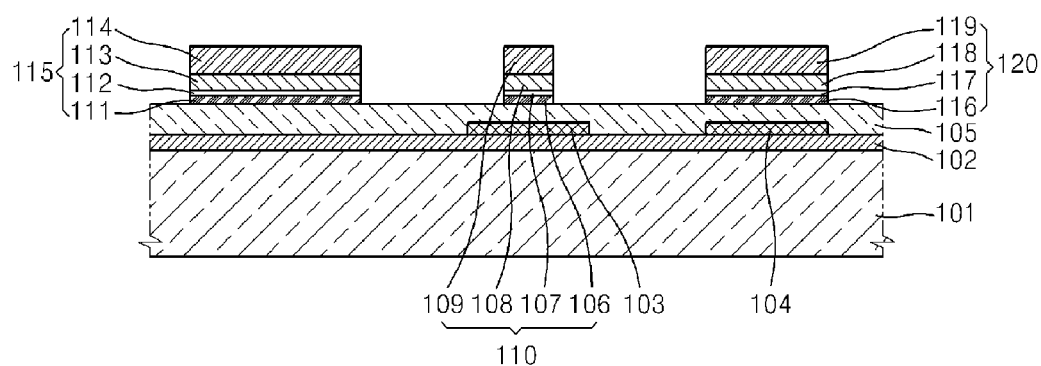

Referring to FIG. 3, the gate insulation layer 105 is formed on the substrate 101, and covers the active layer 103 and the capacitor lower electrode 104, and the gate electrode 110, the pixel electrode 115, and the capacitor upper electrode 120 are formed on the gate insulation layer 105. In some embodiments, the gate electrode 110, the pixel electrode 115, and the capacitor upper electrode 120 may be formed by stacking the same materials and using a photolithography method using one mask.

In the embodiment shown, the gate electrode 110, the pixel electrode 115, and the capacitor upper electrode 120 each include four layers. The four layers may be stacked, and the first layers (first gate electrode layer 106, first electrode layer 111 and first capacitor electrode layer 116) may include Ag, the second layers (second gate electrode layer 107, second electrode layer 112 and second capacitor electrode layer 117) may include $Al_2O_3$, the third layers (third gate electrode layer 108, third electrode layer 113 and third capacitor electrode layer 118) may include ITO, and the fourth layers (fourth gate electrode layer 109, fourth electrode layer 114 and fourth capacitor electrode layer 119) may include MoW, Al and Mo. The four layers may be formed with predetermined patterns by using a photolithography method to form the gate electrode 110, the pixel electrode 115, and the capacitor upper electrode 120.

Figure 4:
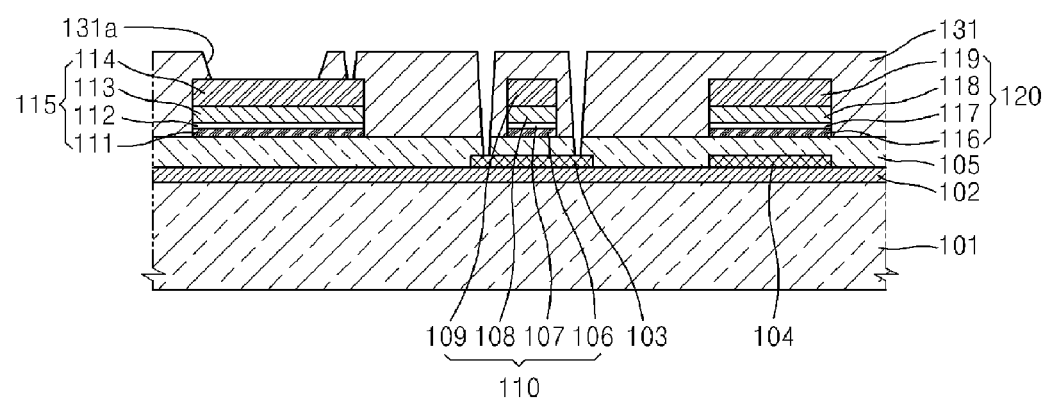

In the embodiment shown, the second electrode layer 112 of the pixel electrode 115 may include an oxide formed by oxidizing the first electrode layer 111 with heat or plasma. When the second electrode layer 112 includes the oxide, the thickness of the second electrode layer 112 may be 3% or less of the thickness of the first electrode layer 111. When the ITO used to form the third electrode layer 113 of the pixel electrode 115 is crystallized during a heat treatment process, the size and number of pin holes formed in the ITO may be increased. The presence of the second electrode layer 112 prevents an etching solution from penetrating into a lower electrode layer through a pin hole of the third electrode layer 113, and thereby prevents damage the lower electrode layer in a subsequent process of forming the first opening portion 114a, when the portion of the fourth electrode layer 114 is removed to expose the third electrode layer 113 through the first opening portion 114a. Referring to FIG. 4, the planarization layer 131 is formed of an insulation material on the gate insulation layer 105, and covers the gate electrode 110, the pixel electrode 115, and the capacitor upper electrode 120. A contact hole is formed in the planarization layer 131. Source and drain regions of the active layer 103 may be exposed through the contact hole. To form the contact hole, a photolithography method may be used. The second opening portion 131a may be formed in the planarization layer 131. The fourth electrode layer 114 of the pixel electrode 115 is exposed through the second opening portion 131a. A hole that exposes the fourth electrode layer 114 of the pixel electrode 115 may further be formed in the planarization layer 131 so as to connect the pixel electrode 115 and a source/drain electrode to be formed later.

Figure 5:
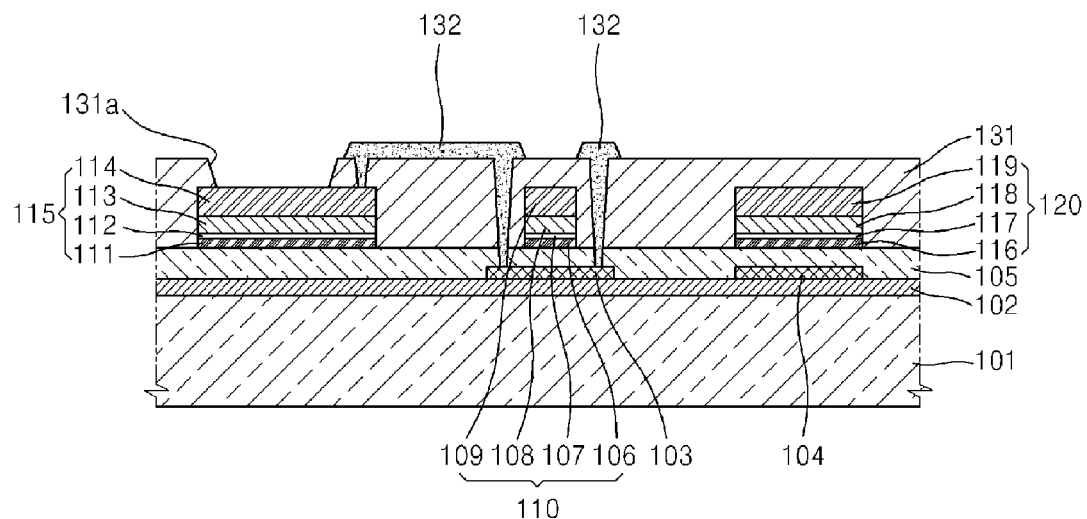

Referring to FIG. 5, the source/drain electrodes 132 are formed. The source/drain electrodes 132 contact the source and drain regions of the active layer 103, respectively. The source/drain electrodes 132 also contact the fourth electrode layer 114 of the pixel electrode 115. The source/drain electrodes 132 may be formed of a multi-layer structure including various conductive layers.

Figure 6:
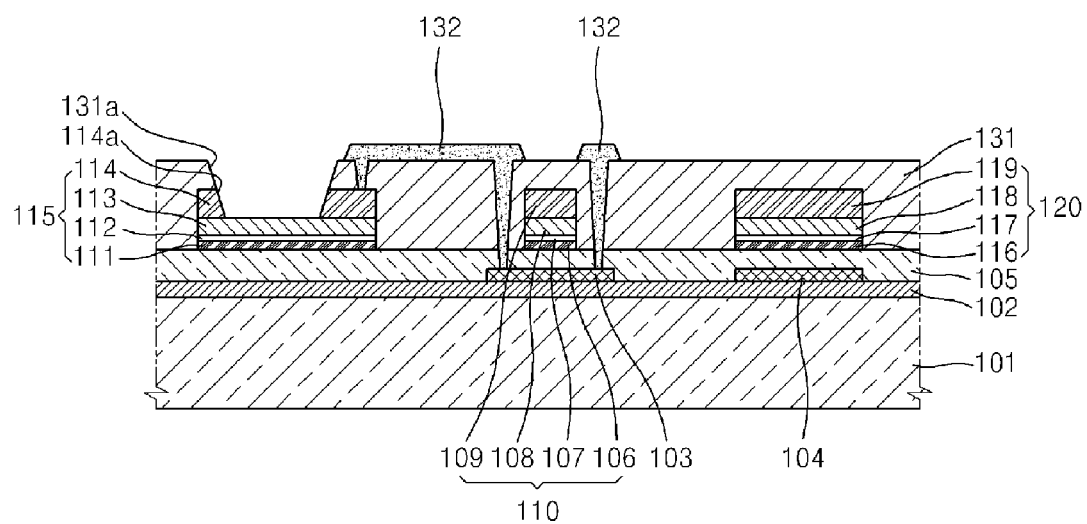

Referring to FIG. 6, the first opening portion 114a is formed in the fourth electrode layer 114 of the pixel electrode 115. The first opening portion 114a may be formed by etching the fourth electrode layer 114 that is exposed through the second opening portion 131a formed in the planarization layer 131. The first opening portion 114a is formed to correspond to the second opening portion 131a.

The fourth electrode layer 114 of the pixel electrode 115 may be etched by using a wet etching process. In some embodiments, an etching solution may include at least one of a phosphoric acid solution, a nitric acid solution, an acetic acid solution and the like. In embodiments where the fourth electrode layer 114 has a multi-layered structure including a first electrode layer including MoW, a second layer formed on the first electrode layer and including Al, and a third layer formed on the second layer and including Mo, the etching solution may be a mixed acid including a phosphoric acid solution, a nitric acid solution, an acetic acid solution or the like. In some embodiments, an amount of the phosphoric acid may be about 70% or less of the entire amount of the etching solution.

The second electrode layer 112 formed on the first electrode layer 111 and including Al or a metal oxide may prevent the first electrode layer 111 from being damaged during processes. Without the second electrode layer 112, while the fourth electrode layer 114 is etched to form the first opening portion 114a, an etching solution may penetrate into a lower electrode layer through a pin hole of the third electrode layer 113. The first electrode layer 111 may thus be corroded and damaged due to the etching solution. When the first electrode layer 111 is damaged, a light resonance structure may not be obtained by transmitting and reflecting light.

Figure 7:
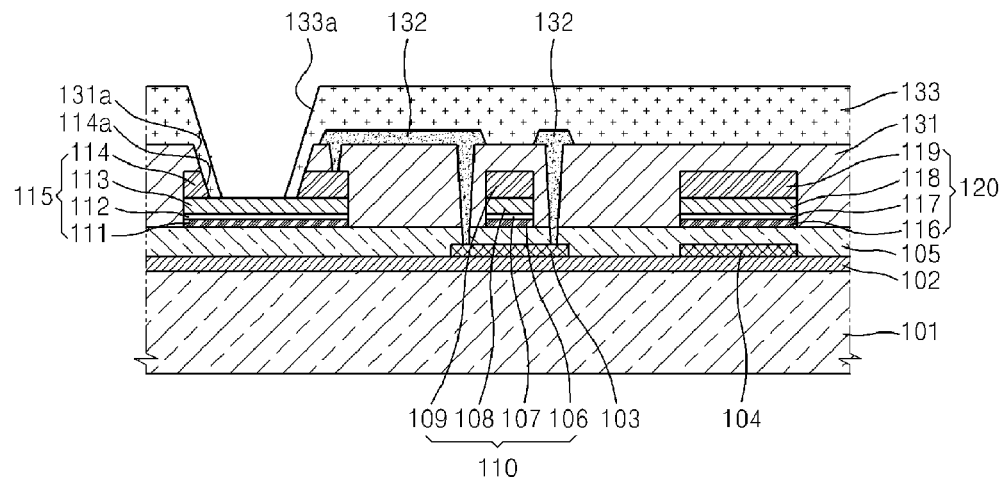

Referring to FIG. 7, the pixel defining layer 133 is formed on the planarization layer 131, and covers the source/drain electrodes 132. The pixel defining layer 133 may be formed of an organic material. The third opening portion 133a may be formed in the pixel defining layer 133 to contact the first opening portion 114a or in the first opening portion 114a. The third electrode layer 113 of the pixel electrode 115 is exposed through the third opening portion 133a.

Figure 8:
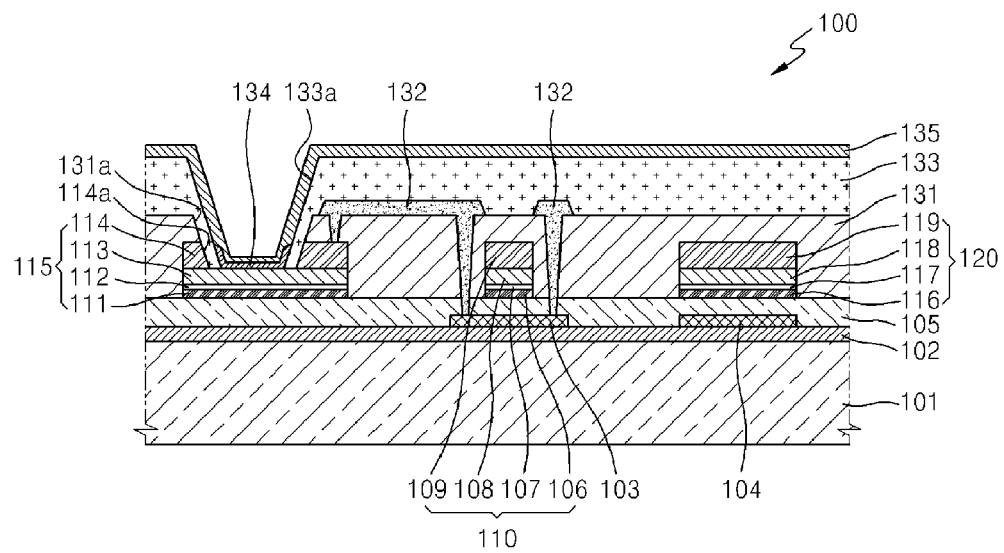

Referring to FIG. 8, the intermediate layer 134 and the opposite electrode 135 are sequentially formed in the order stated on the third electrode layer 113 of the pixel electrode 115, which is exposed through the third opening portion 133a of the pixel defining layer 133, and on the pixel defining layer 133. The intermediate layer 134 includes an organic light-emitting layer. Materials for forming the intermediate layer 134 and the opposite electrode 135 are the same as described above and thus descriptions thereof will be omitted.

Although not shown in FIG. 8, a sealing member may be disposed on the opposite electrode 135 to face a surface of the substrate 101. The sealing member may be formed to protect the intermediate layer 134 from water or oxygen from the outside, and may be formed of a transparent material. In some embodiments, the sealing member may be formed of glass, plastic, or a multi-layer structure of organic and inorganic materials.

Figure 9:
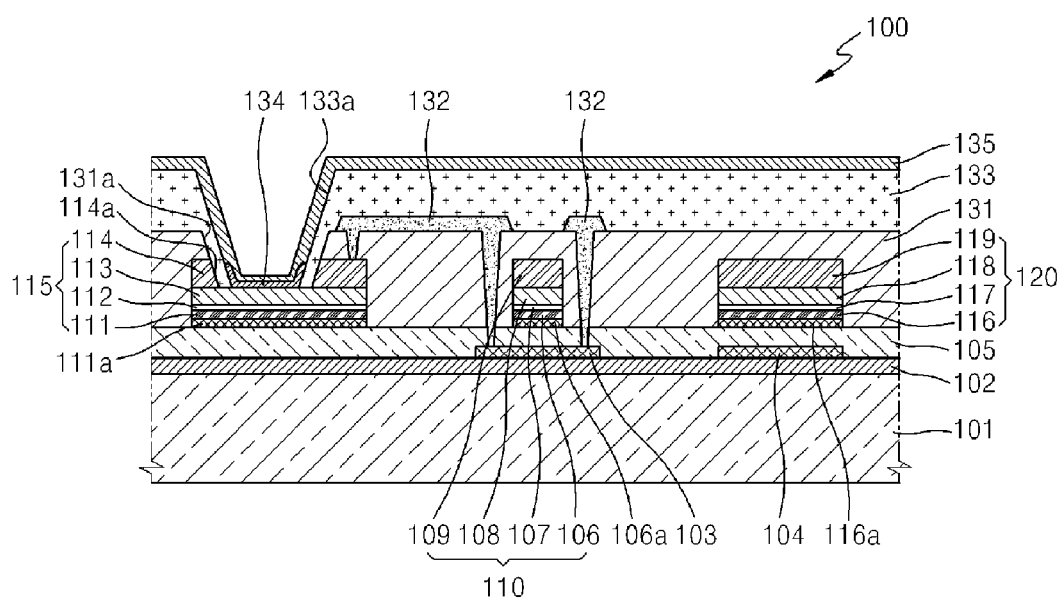
FIG. 9 is a cross-sectional view of another embodiment of an organic light-emitting display apparatus.

FIG. 9 is a cross-sectional view of another embodiment of an organic light-emitting display apparatus 100. The embodiment of organic light-emitting display apparatus 100 of FIG. 9 includes a barrier layer 111a, formed below the first electrode layer 111 of the pixel electrode 115. The embodiment also includes a gate barrier layer 106a, formed below the first gate electrode layer 106 of the gate electrode 110, and a capacitor barrier layer 116a formed below the first capacitor electrode layer 116 of the capacitor upper electrode 120. Other elements have the same or similar functions as in the above-described embodiments, and thus their detailed descriptions will not be repeated. The pixel electrode 115 will be described in detail. Since the gate electrode 110 and the capacitor upper electrode 120 are formed of the same material in the same layer level as the pixel electrode 115, and have the same structure as the pixel electrode 115, their detailed descriptions will not be repeated.

Referring to FIG. 9, the pixel electrode 115 includes the barrier layer 111a formed on the gate insulation layer 105, the first electrode layer 111 formed on the barrier layer 111a and including a semi-transmissive conductive material, the second electrode layer 112 formed on the first electrode layer 111 and protecting the first electrode layer 111, the third electrode layer 113 formed on the second electrode layer 112 and including a transparent conductive material, and the fourth electrode layer 114 formed on the third electrode layer 113 and including a conductive material.

The barrier layer 111a may be formed below the first electrode layer 111, and may include at least one of ITO, IZO, a Zn oxide, GZO, GIZO, GaZO, ZnO and $In_2O_3$. By forming the barrier layer 111a, an adhesive force between the first electrode layer 111 and the gate insulation layer 105 may be increased. Consequently, during a patterning operation, an etching solution and moisture may be prevented from penetrating into the organic light-emitting display apparatus 100, thereby improving the reliability of the organic light-emitting display apparatus 100.

In some embodiments, the gate electrode 110 and the pixel electrode 115 may be formed of the same material in the same layer level, thereby reducing the number of processes. In addition, the capacitor lower electrode 104 and the active layer 103 may be formed of the same material in the same layer level at the same time, and the capacitor upper electrode 120 and the gate electrode 110 may be formed at the same time, thereby further reducing the number of processes.

In some embodiments, by forming the pixel electrode 115 to have a stacked structure including four layers, where the second electrode layer 112 protects the first electrode layer 111, a surface of the first electrode layer 111 may be prevented from being damaged in a subsequent process. In addition, since the second electrode layer 112 includes an oxide, a reduction in the optical efficiency of the organic light-emitting display apparatus 100, due to the first electrode layer 111 as a semi-transmissive conductive layer, may be prevented.

In some embodiments, the flat display apparatus may include an organic light-emitting display apparatus. In other embodiments, various display apparatuses may include a liquid crystal display (LCD) apparatus or the like.

In the described embodiments, a single thin film transistor and a single capacitor are illustrated for convenience of illustration. In other embodiments, the organic light-emitting display apparatus may include a plurality of thin film transistors and a plurality of capacitors.

In some embodiments, since the organic light-emitting display apparatus may be manufactured by using a small number of masks, costs may be reduced due to a reduction in the number of masks and simplification of processes.

In some embodiments, a pixel electrode has a multi-layered structure including a second electrode layer, and the second electrode layer may prevent a first electrode layer from being damaged through a hole formed in a third electrode layer when a fourth electrode layer of the pixel electrode is etched. In addition, the pixel electrode may include a second electrode layer, and thus a reduction in the optical efficiency of the organic light-emitting display apparatus due to the first electrode layer as a semi-transmissive conductive layer may be prevented.

While certain embodiments have been particularly shown and described, it will be understood by those of ordinary skill in the art that various changes in form and details may be made therein without departing from the spirit and scope of the present invention as defined by the following claims.

What is claimed is:

1. An organic light-emitting display apparatus comprising:
   an active layer formed on a substrate;
   a gate electrode comprising:
      a first gate electrode layer insulated from the active layer and comprising a semi-transmissive conductive material,
      a second gate electrode layer formed on the first gate electrode layer configured to protect the first gate electrode layer,
      a third gate electrode layer formed on the second gate electrode layer and comprising a transparent conductive material, and
      fourth gate electrode layer formed on the third gate electrode layer and comprising a conductive material;
   a pixel electrode comprising:
      a first electrode layer formed in the same layer level as the first gate electrode layer and comprising a semi-transmissive conductive material,
      a second electrode layer formed on the first electrode layer configured to protect the first electrode layer,
      third electrode layer formed on the second electrode layer and comprising a transparent conductive material, and
      a fourth electrode layer formed on the third electrode layer and comprising a conductive material;
   source and drain electrodes insulated from the gate electrode and electrically connected to the active layer and the pixel electrode;
   an intermediate layer formed on the pixel electrode and comprising an organic light-emitting layer; and
   an opposite electrode formed on the intermediate layer.

2. The organic light-emitting display apparatus of claim 1, wherein each of the first gate electrode layer and the first electrode layer comprises at least one of an aluminum (Al) alloy, titanium (Ti), molybdenum (Mo), MoW, and silver (Ag).

3. The organic light-emitting display apparatus of claim 1, wherein each of the second gate electrode layer and the second electrode layer comprises at least one of Al, an Al oxide, an oxide of an Al alloy, a Ti oxide, a Mo oxide, a MoW oxide, and an Ag oxide.

4. The organic light-emitting display apparatus of claim 1, wherein each of the third gate electrode layer and the third electrode layer comprises at least one of ITO, IZO, ZnO, GZO, GIZO, GaZO, a Zn oxide and $In_2O_3$.

5. The organic light-emitting display apparatus of claim 1, wherein each of the fourth gate electrode layer and the fourth electrode layer comprises at least one of silver (Ag), magnesium (Mg), aluminium (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and aluminium/copper (Al/Cu).

6. The organic light-emitting display apparatus of claim 1, wherein the pixel electrode further comprises:
   a barrier layer formed below the first electrode layer of the pixel electrode,
   wherein the barrier layer comprises at least one of ITO, IZO, ZnO, GZO, GIZO, GaZO, a Zn oxide and $In_2O_3$.

7. The organic light-emitting display apparatus of claim 1, wherein the fourth electrode layer comprises an opening configured to expose the third electrode layer formed below the fourth electrode layer.

8. The organic light-emitting display apparatus of claim 1, wherein the intermediate layer contacts the third electrode layer of the pixel electrode.

9. The organic light-emitting display apparatus of claim 1, further comprising:
   a capacitor lower electrode layer formed on the same layer level as the active layer, and spaced apart from the active layer; and
   a capacitor upper electrode layer comprising:
      a first capacitor electrode layer insulated from the capacitor lower electrode layer, and formed on the same layer level as the pixel electrode, wherein the first capacitor electrode layer corresponds to the first electrode layer, and wherein the first capacitor electrode layer comprises a semi-transmissive conductive material,
      a second capacitor electrode layer formed on the first capacitor electrode layer and comprising at least one of an oxide or Al,
      a third capacitor electrode layer formed on the second capacitor electrode layer and comprising a transparent conductive material, and
      a fourth capacitor electrode layer formed on the third capacitor electrode layer and comprising a conductive material.

10. A method of manufacturing an organic light-emitting display apparatus according to claim 1, the method comprising:
    forming the active layer on the substrate;
    forming the gate electrode;
    forming the pixel electrode;
    forming the source and drain electrodes;
    forming the intermediate layer on the pixel electrode; and
    forming the opposite electrode on the intermediate layer.

11. The method of claim 10, wherein each of the first gate electrode layer and the first electrode layer comprises at least one of an aluminum (Al) alloy, titanium (Ti), molybdenum (Mo), MoW, and silver (Ag).

12. The method of claim 10, wherein each of the second gate electrode layer and the second electrode layer comprises Al, or at least one of an Al oxide, an oxide of an Al alloy, a Ti oxide, a Mo oxide, a MoW oxide, and a Ag oxide, and wherein the second gate electrode layer and the second electrode layer are respectively formed by oxidizing each of the first gate electrode layer and the first electrode layer with heat or plasma.

13. The method of claim 10, wherein each of the third gate electrode layer and the third electrode layer comprises at least one of ITO, IZO, ZnO, GZO, GIZO, GaZO, a Zn oxide, and $In_2O_3$.

14. The method of claim 10, wherein each of the fourth gate electrode layer and the fourth electrode layer comprises at least one of silver (Ag), magnesium (Mg), aluminium (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and aluminium/copper (Al/Cu).

15. The method of claim 10, further comprising:
    forming a barrier layer formed below the first electrode layer of the pixel electrode,
    wherein the barrier layer comprises at least one of ITO, IZO, ZnO, GZO, GIZO, GaZO, a Zn oxide, and $In_2O_3$.

16. The method of claim 10, wherein the gate electrode and the pixel electrode are formed at the same time.

17. The method of claim 10, further comprising: forming an opening portion in the fourth electrode layer so as to expose the third electrode layer.

18. The method of claim 10, further comprising:
    forming a capacitor lower electrode layer on the same layer level as the active layer, and spaced apart from the active layer; and
    forming a capacitor upper electrode layer, which comprises:
       a first capacitor electrode layer insulated from the capacitor lower electrode layer, on the same layer level as the pixel electrode and corresponding to the first electrode layer, and comprising a semi-transmissive conductive material,
       a second capacitor electrode layer on the first capacitor electrode layer and comprising an oxide or Al,
       a third capacitor electrode layer on the second capacitor electrode layer and comprising a transparent conductive material, and
       fourth capacitor electrode layer on the third capacitor electrode layer and comprising a conductive material.

* * * * *

UNITED STATES PATENT AND TRADEMARK OFFICE
CERTIFICATE OF CORRECTION

| | |
|---|---|
| PATENT NO. | : 8,319,221 B2 |
| APPLICATION NO. | : 13/102419 |
| DATED | : November 27, 2012 |
| INVENTOR(S) | : Jong-Hyun Choi, Sung-Ho Kim and Joon-Hoo Choi |

It is certified that error appears in the above-identified patent and that said Letters Patent is hereby corrected as shown below:

In the Specifications:

At column 3, line 15, please delete "polyethyelene napthalate", and insert --polyethylene naphthalate--.

At column 3, line 15-16, please delete "polyethyelene", and insert --polyethylene--.

At column 3, line 25, before "be formed" delete "may".

In the Claims:

At column 10, line 42, Claim 1, before "fourth" insert --a--.

At column 10, line 50, Claim 1, before "third" insert --a--.

At column 12, line 53, Claim 8, before "fourth" insert --a--.

Signed and Sealed this
Thirtieth Day of July, 2013

Teresa Stanek Rea
*Acting Director of the United States Patent and Trademark Office*